United States Patent
Mehrotra et al.

(10) Patent No.: US 10,599,881 B1
(45) Date of Patent: Mar. 24, 2020

(54) CIRCUIT SIMULATION WAVEFORM GENERATION AND DISPLAY

(71) Applicant: Berkeley Design Automation, Inc., Santa Clara, CA (US)

(72) Inventors: Amit Mehrotra, Mountain View, CA (US); Francois Le Grix, San Francisco, CA (US); Paul Estrada, Los Altos, CA (US)

(73) Assignee: Mentor Graphics Corporation, Wilsonville, OR (US)

( * ) Notice: Subject to any disclaimer, the term of this patent is extended or adjusted under 35 U.S.C. 154(b) by 1220 days.

(21) Appl. No.: 14/225,274

(22) Filed: Mar. 25, 2014

(51) Int. Cl.
  *G06F 17/50* (2006.01)
  *G06F 30/367* (2020.01)

(52) U.S. Cl.
  CPC .................. *G06F 30/367* (2020.01)

(58) Field of Classification Search
  CPC .................................................. G06F 17/5036
  USPC ...................................................... 703/13, 14
  See application file for complete search history.

(56) References Cited

U.S. PATENT DOCUMENTS

| | | | | |
|---|---|---|---|---|
| 5,050,091 A * | 9/1991 | Rubin | ................. | G06F 17/5068 716/122 |
| 6,721,922 B1 * | 4/2004 | Walters | ............... | G06F 17/5022 716/102 |
| 6,789,055 B1 * | 9/2004 | Kuriyama | ........... | G06F 17/5031 327/155 |
| 8,195,439 B1 * | 6/2012 | Hussain | .............. | G06F 17/5036 703/14 |
| 8,601,420 B1 * | 12/2013 | Keller | ................. | G06F 17/5036 716/108 |
| 2003/0139918 A1 * | 7/2003 | Hardwick | ............. | G06F 9/5011 703/22 |
| 2003/0229872 A1 * | 12/2003 | Tatsukawa | .......... | G06F 17/5036 716/106 |
| 2004/0044510 A1 * | 3/2004 | Zolotov | .............. | G06F 17/5036 703/14 |
| 2005/0125750 A1 * | 6/2005 | Lorenz | ................ | G06F 17/5009 716/102 |

OTHER PUBLICATIONS

Steer (SPICE: User's Guide and Reference, 2007 (308 pages)).*

* cited by examiner

*Primary Examiner* — Andre Pierre Louis
(74) *Attorney, Agent, or Firm* — Mentor Graphics Corporation

(57) ABSTRACT

Simulation waveforms representative of simulation progress are generated and outputted for display. A netlist describing a circuit is accessed, and the circuit is simulated over a simulation runtime period. A simulation completion measurement is determined for the simulation runtime period, and a simulation waveform is generated based on the determined simulation completion measurement. Other simulation waveforms can be generated, for instance waveforms representative of a processing resource load over the simulation runtime period. Multiple simulation waveforms can be correlated and displayed in conjunction with each other, for instance in a common waveform interface.

20 Claims, 5 Drawing Sheets

CIRCUIT SIMULATION WAVEFORM GENERATION AND DISPLAY

TECHNICAL FIELD

The present invention relates to computer-aided circuit simulation, and, more specifically, to computer-aided transistor-level circuit simulation and the generation of simulation waveforms.

BACKGROUND OF THE INVENTION

Integrated circuit and electronic systems designers use circuit simulators to simulate how their transistor-level circuits will behave in response to time-based inputs, for example realistic radio signals, analog signals, or digital signals. Timing conditions and requirements associated with or dependent on signal propagation within a circuit can be computationally expensive to simulate for complicated circuits. In such instances, circuit behavior can take hours or days to simulate.

In view of the extended length of time that some simulations require, designers generally start a simulation and periodically monitor the simulation as it progresses. For instance, a designer can monitor simulation log files to ensure that the simulation is progressing reasonably, or can view simulation output waveforms including signals representative of a circuit's inputs, outputs, or internal node signals. As used herein, "waveform" refers to both a series of discrete data points output by a simulator and representative of a simulation of a circuit, and to a curve fit to such a series of discrete points displayed by a waveform viewer. By monitoring simulation conditions, timing, and behavior, a designer can determine the success or usefulness of a simulation prior to the end of the simulation, allowing the designer to halt unsuccessful simulations early, saving time and processing resources that would otherwise be required to finish the simulation.

Upon the completion of a simulation, a designer can view the waveforms and/or specific measurements defined before the simulation, and can post-process waveforms to create custom figures, such as signal-to-noise ratio or oscillation frequency representations of the waveforms. Designers can also review a corresponding simulation log file that includes information about the circuit, simulation settings, simulation warnings and error messages, simulation runtime information, and simulator recommendations to improve simulation accuracy and/or performance in subsequent simulations (for instance, simulating the same circuit with different simulation settings).

Designers generally run many simulations of slightly different versions of a circuit as they make changes to improve the design, and as they re-simulate a circuit under different operating, environmental, and process conditions. Currently, designers must develop familiarity with the simulation of a circuit and its derivatives under various conditions over time in order to tune the simulator's performance and to debug any issues related to the simulator-circuit interaction. Such an approach is both inefficient and ineffective. Standard simulation outputs do not provide designers an easy way to correlate simulation output measurements and waveforms with simulator performance. Such information would enable a designer to determine how long a simulation will take, to identify portions of the simulation that run efficiently or inefficiently, to identify simulation bottlenecks, and as a result, save simulation time and resources by improving simulation performance.

SUMMARY OF THE INVENTION

Simulation waveforms representative of a simulator's performance in simulating the behavior of a circuit are generated and can be correlated with simulation measurements and other simulation waveforms. A simulator accesses a circuit netlist or other description of a circuit, and simulates the behavior of the circuit based on a set of simulation settings (selected, for instance, by the circuit designer). The simulator generates one or more simulation performance waveforms and corresponding output files. For example, a simulator can generate a waveform of a simulation completion measurement versus simulation runtime, a waveform of simulator resource utilization versus simulation runtime, a waveform of internal simulator parameter values versus simulation runtime, and the like. A user can view generated waveforms to determine and improve simulator efficiency during and after a simulation, for example by alleviating bottlenecks. For instance, a user can correlate multiple simulation waveforms for simultaneous or adjacent display, and can adjust simulator parameters or circuit design based on analyzing the multiple-waveform display. In addition, the simulator itself can use simulation outputs to automatically improve the performance of subsequent similar runs.

BRIEF DESCRIPTION OF THE DRAWINGS

The teachings of the present invention can be readily understood by considering the following detailed description in conjunction with the accompanying drawings. Like reference numerals are used for like elements in the accompanying drawings.

The figures depict embodiments of the present invention for purposes of illustration only. One skilled in the art will readily recognize from the following discussion that alternative embodiments of the structures and methods illustrated herein may be employed without departing from the principles of the invention described herein.

DETAILED DESCRIPTION

An embodiment of a simulation system is now described with reference to the figures where like reference numbers indicate identical or functionally similar elements.

System Architecture

Figure 1:
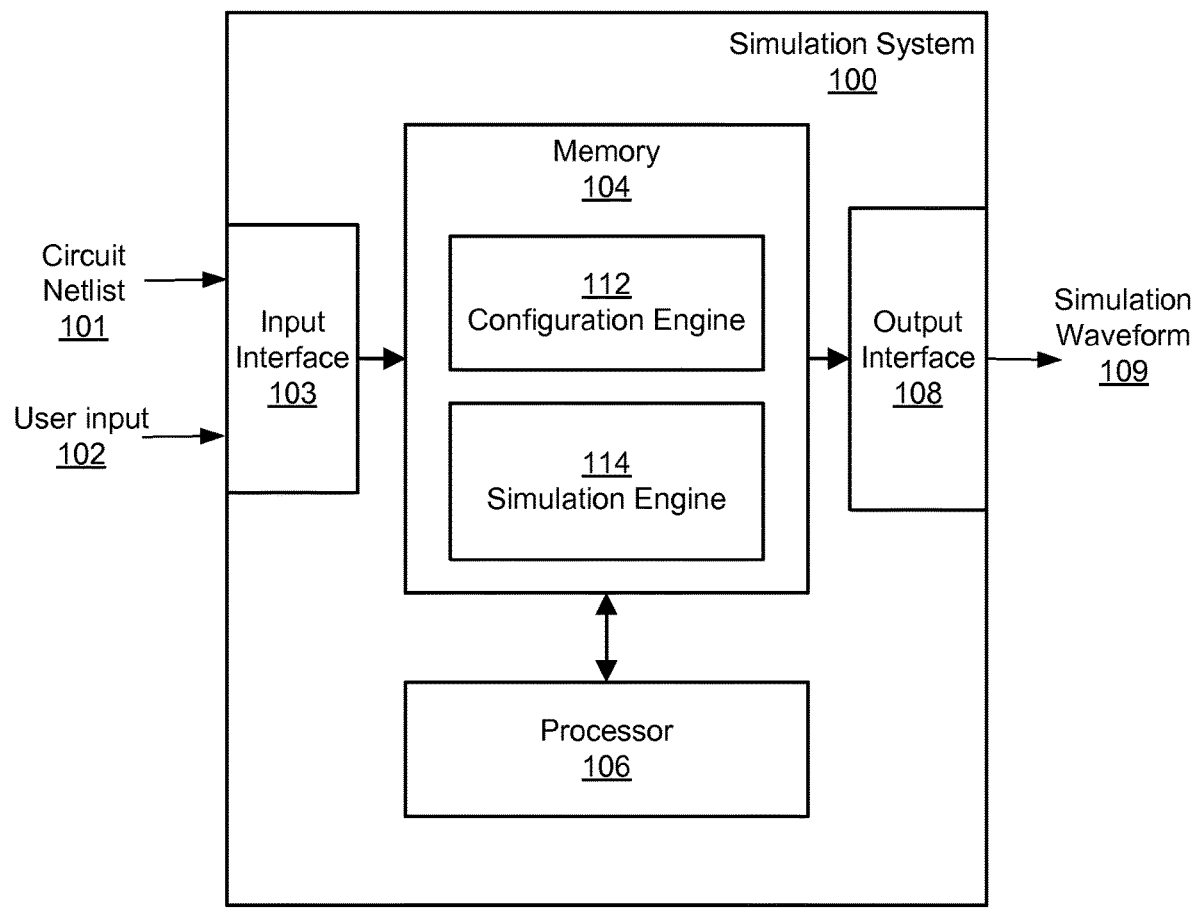
FIG. 1 is a block diagram illustrating a simulation system according to one embodiment of the present invention.

FIG. 1 is a block diagram illustrating a simulation system according to one embodiment of the present invention. The simulation system 100 includes an input interface 102, a memory 104, a processor 106, and an output interface 108. In other embodiments, the simulation system includes different or additional components than those illustrated in the embodiment of FIG. 1.

The input interface 103 is configured to receive inputs from an external entity (such as a user or a computing device communicatively coupled to the simulation system 100), and to provide the received inputs to the memory 104. Examples of such inputs include a circuit netlist 101 or any other suitable circuit representation, and a user input 102, such as user-selected simulation parameters, a simulation system configuration, or a simulation waveform output configuration. In some embodiments, the inputs are received from a computer, an external memory, or a user device (such as a keyboard, a mouse, and the like), or from a computer device communicatively coupled to the simulation system through a connecting network, such as a local area network (LAN), the Internet, or any other network capable of providing inputs from an external entity to the simulation system.

The output interface 108 is configured to receive simulation results from the memory 104, and to output one or more simulation waveforms 109 based on the simulation results. It should be noted that the term "waveform" is used herein to cover any representation of signals, values, data, or properties of simulation, and may be continuous or discrete in form. In some embodiments, the output waveforms described herein are graphs or sets of plotted points. In some embodiments, the output interface is coupled to a monitor or other display device configured to display the simulation waveforms, for instance using waveform viewer software. In some embodiments, the output interface outputs multiple simulation waveforms for simultaneously or adjacent display. The output interface can also receive other data or information associated with a circuit simulation, and can output such data or information for display, for instance in conjunction with a generated simulation waveform. In some embodiments, the output interface can output simulation waveforms and other simulation data for storage in an external memory, for transmission to an external entity (for instance, via a connecting network), or for transmission to a communicatively coupled device.

The processor 106 processes data signals and can include various computing architectures such as a complex instruction set computer (CISC) architecture, a reduced instruction set computer (RISC) architecture, or an architecture implementing a combination of instruction sets. Although only a single processor is shown in FIG. 1, multiple processors may be included. The processor is configured to access and execute executable computer instructions stored on the memory 104, for instance instructions configured to (when executed) simulate the behavior of a circuit, and is configured to produce waveforms representative of the behavior a simulated circuit. The processor can include one or more of an arithmetic logic unit, a microprocessor, a general purpose computer, or any other device configured to transmit, receive and process electronic data signals based on instructions stored by or received from the memory 104, the input interface 102, or the output interface 108.

The memory 104 stores computer-executable instructions and computer-readable data, data received from the input interface 103 (such as a circuit netlist 101 or a user input 102), data to be outputted by the output interface 108, and any intermediate data created during the simulation of a circuit. The computer instructions are configured to perform the functionalities of the configuration engine 112 and the simulation engine 114 (also referred to as a "simulator") as described herein. Memory may be a dynamic random access memory (DRAM) device, a static random access memory (SRAM) device, Flash RAM (non-volatile storage), combinations of the above, or some any other suitable memory device. In operation, the processor 106 loads the computer-executable instructions and/or data from the memory to carry out the process steps described herein.

In the embodiment of FIG. 1, the memory 104 stores a configuration engine 112 and a simulation engine 114, though it should be noted that in other embodiments, the memory stores different or additional modules that those illustrated herein. The configuration engine receives the user input 102 specifying one or more simulation configuration options, and generates a set of simulator settings based on the user input. The simulator settings include a circuit to be simulated, a type of analysis to be performed, and analysis-specific parameters. In some embodiments, the simulator settings can include a length of simulation, a format or type of simulation waveform output, a set of inputs for use in simulating the behavior of the circuit, and the like. The configuration engine can generate a set of simulator settings based on factors other than the user input, such as processing resources available to the simulation engine, a type of circuit being simulated, previous circuit simulation outputs, and the like. The configuration engine can store generated sets of simulator settings, and the simulation engine can simulate a circuit's behavior based on a stored set of simulator settings, a set of simulator settings generated for the purpose of simulating the circuit's behavior, or a default set of simulator settings.

The simulation engine 114 is configured to receive a set of simulation settings from the configuration engine 112, and is configured to simulate the behavior of a circuit according to the set of simulation settings. The simulation engine accesses a circuit netlist identified by the set of simulation settings from the memory 104 (for instance the circuit netlist 101, or a previously received circuit description). The circuit netlist can include a description of circuit components, component behavior, and connectivity between the circuit components. The simulation engine stores analytical models modeling the behavior of a variety of circuit components (e.g., capacitors, inductors, transistors, diodes, etc.) that are typically included in electronic circuits. The simulation engine generates equations representing the circuit described in the accessed netlist and based on the set of simulation settings, and executes one or more equation solvers or algorithms for solving the generated equations. For example, in one embodiment, the simulation engine provides computer-executable program instructions for simulating the behavior of a circuit described by an accessed circuit netlist in order to enable a designer to test and modify a circuit based on the results of the simulation.

Simulator Waveform Generation

During or after the simulation of a circuit's behavior, the simulation engine 114 is configured to generate simulated waveform and non-waveform outputs representative of the simulation for display. In the embodiment of FIG. 1, the simulation engine generates the simulation waveform 109 for output by the output interface 108. The simulation engine can generate waveforms representative of any aspect of, data value associated with, or property of the simulation of a circuit's behavior. It should be noted that although certain types of simulation waveforms are described and illustrated herein, the simulation engine can generate any simulation waveform suitable for displaying some aspect of the performance or operation of the simulator or the behavior of the circuit during simulation.

Figure 2A:
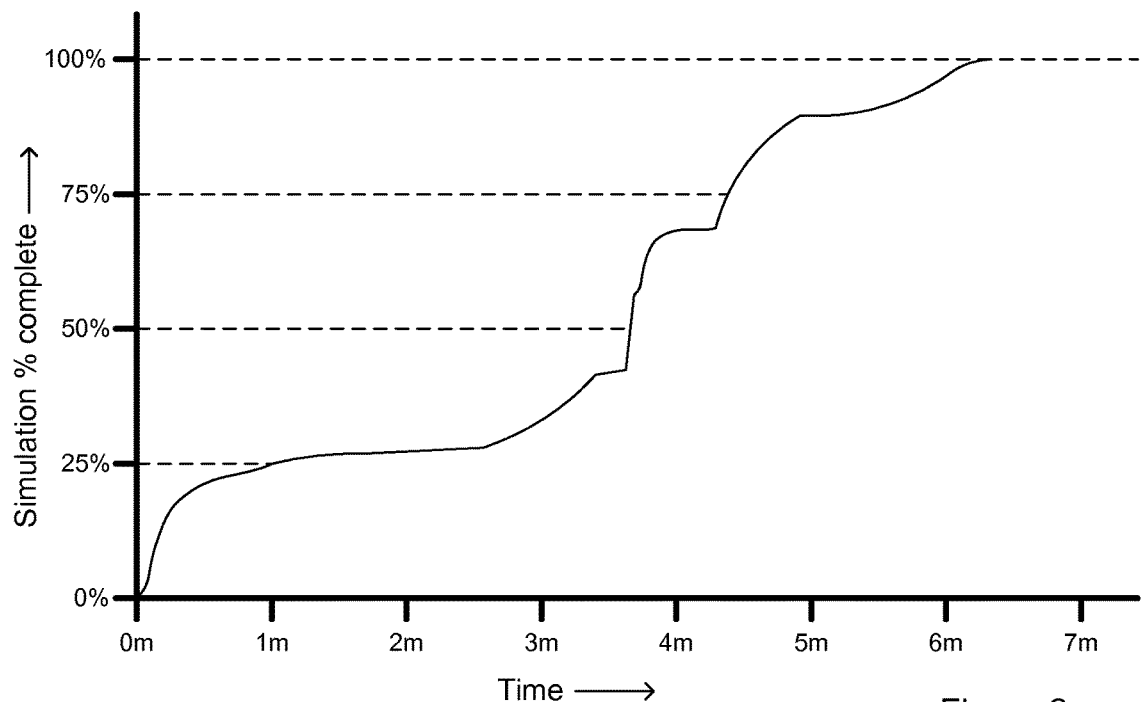
FIG. 2a is an output waveform illustrating a simulation completion measurement over time, according to one embodiment.

FIG. 2a is an output waveform illustrating a simulation completion measurement over time, according to one embodiment. A simulation completion measurement is a measurement representative of the progress of the simulator in simulating the circuit's behavior. For example, the simulation completion measurement can represent the simulated circuit time completed versus the simulator runtime, the percentage of the simulated circuit time completed versus the simulator runtime, the percentage of the simulated circuit time completed versus the number of simulator timesteps, or any other suitable metric representing the progress of the simulator.

FIG. 2a illustrates a simulation completion measurement on a Y-axis versus the simulation runtime on an X-axis. A waveform illustrating a simulation completion measurement versus simulation runtime is referred to herein as a "simulation progress waveform." The slope of the waveform at a given time represents the rate at which the simulation is progressing. Portions of the waveform with the greatest slopes are progressing fastest, and portions with the smallest slopes are progressing slowest. Although the simulation progress waveform of FIG. 2a illustrates a simulation completion measurement, other embodiments can map an estimated simulation runtime versus the actual simulation runtime or the rate of simulation progress (the first derivative of a simulation completion measurement) versus the simulation runtime. Using waveform display tools, designers can view one or more simulation progress waveforms, and can correlate and view simulation progress waveforms with other circuit waveforms (such as waveforms including signals representative of circuit output values or internal node values during simulation). Such waveforms allow designers to analyze circuit activity versus simulation performance.

In simulation progress waveforms, the simulation completion measurement can range from 0% to 100%, increasing over time as the simulator progresses in the simulation of a circuit's behavior. In the embodiment of FIG. 2a, the simulation starts quickly, progressing to 25% complete within the first minute before slowing considerably between 60 seconds and 150 seconds after the simulation begins. The simulation advances to approximately 65% complete over the next 90 seconds before temporarily slowing again. Progress advances at about 4 minutes and 15 seconds after the start of the simulation to about 90% complete, and slowly advances to 100% completion over the next 75 seconds. The rapid changes in the rate of simulation progress illustrated in FIG. 2a is typical of many circuit simulations due to differences in the level of circuit activity (with higher activity requiring more computation time) and due to difficulties that the simulator has in solving complex equations under non-optimal conditions.

Viewing a simulation progress waveform allows designers to confirm whether the simulator is behaving as expected or to identify problem areas within the simulation that indicate possible circuit problems or opportunities to improve simulation performance of subsequent similar runs by using different simulator settings. The simulator itself may be able to use simulation progress waveforms to improve subsequent simulations of the circuit or variations of the circuit.

A designer can display a simulation progress waveform from a simulation of a circuit known to satisfy one or more simulation criteria (such as a minimum simulation time), and can use this simulation progress waveform as a basis for comparison with subsequent simulations of the circuit with different simulation settings. If progress of a subsequent simulation is slower than the original, a designer can quickly determine that the subsequent simulation is less optimal than the original simulation, can stop the simulation, and can attempt a new simulation with different simulation settings. Similarly, a designer can compare simulation progress waveforms associated with simulations performed by different numbers of processor cores to determine if additional processor cores provide a proportionate or expected benefit. Simulation progress waveforms associated with simulations of a circuit based on various simulation settings can be displayed in a waveform viewer at the same time, allowing a designer to compare the performance of analogous portions of simulations.

Figure 2B:
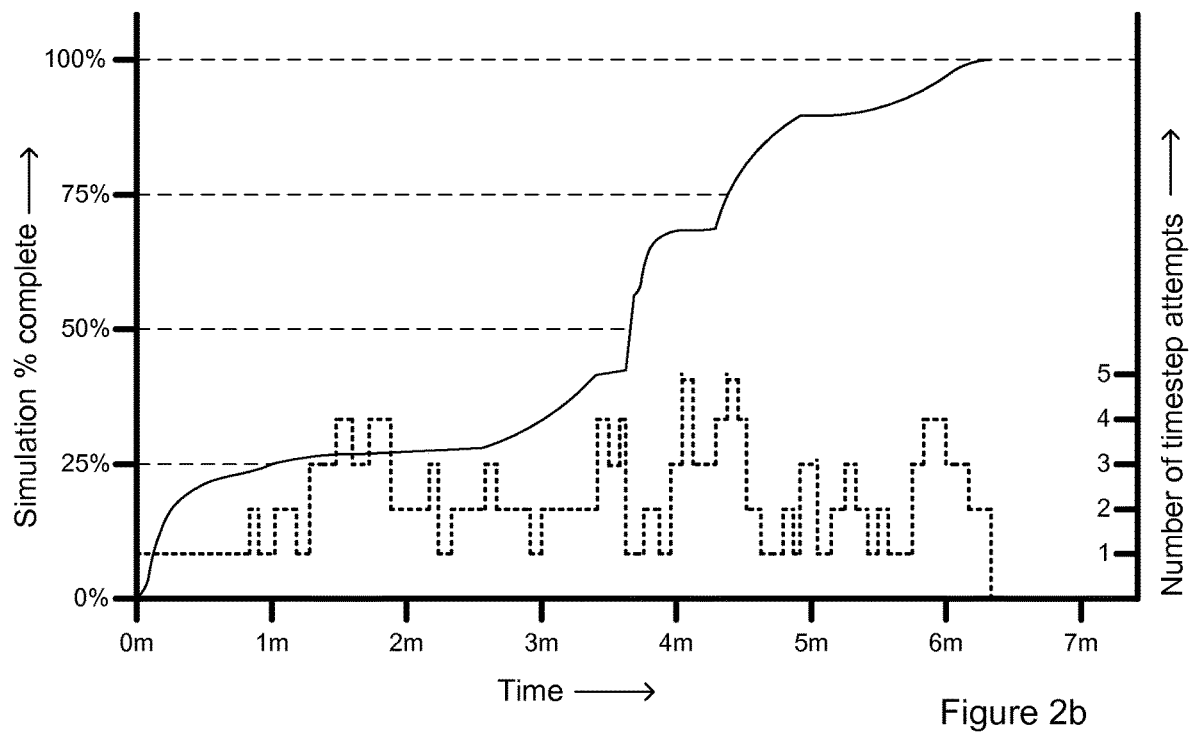
FIG. 2b is an output waveform illustrating the simultaneous display of a simulation completion measurement waveform and a number of attempted timesteps during simulation runtime, according to one embodiment.

Data associated with a simulation can be output, for instance in a simulation waveform output file, a log file, or other file, and incorporated into an overlay display of a simulation progress waveform by a waveform viewer. For example, a simulator can output a number of attempted timesteps required at each time during simulation. FIG. 2b is an output waveform illustrating the simultaneous display of a simulation completion measurement waveform and a number of attempted timesteps during simulation runtime, according to one embodiment.

In the embodiment of FIG. 2b, the simulation progress waveform of FIG. 1 is illustrated in conjunction with a number of timesteps attempted by the simulator in simulating a circuit's behavior. In operation, a simulator attempts to simulate a circuit's behavior over a time interval referred to herein as a "timestep" which the simulator varies during the simulation. If the simulator is unable to solve a set of equations or variables associated with the circuit's behavior over the timestep subject to residual tolerance constraints, the simulator attempts to solve the circuit's behavior over a shorter timestep. This process is repeated until the simulator selects a timestep short enough that the simulator is able to simulate the circuit's behavior over the timestep such that any residual tolerance constraints are satisfied or is unable to do so.

Generally in the embodiment of FIG. 2b, slower simulator progress is associated with more timestep attempts, and faster simulator progress is associated with fewer timestep attempts. It should be noted that although the number of timestep attempts is overlaid with a simulation progress waveform in the embodiment of FIG. 2b, other types of simulator data can be overlaid with a simulation progress waveform, such as a hardware resource usage, a contribution of a simulator portion to the required simulation time, a matrix computation or equation solver residual, a circuit property (such as an output or internal node value), a limiting circuit component, and the like.

The simulation engine 114 can produce output waveforms illustrating the usage of one or more resources during the simulation of a circuit's behavior. For example, the simulation engine can produce an output waveform illustrating a hardware resource usage, such as a number of cores used during simulation, simulation memory usage, disk space required during simulation, and the like. In addition, the simulation engine can produce an output waveform illustrating the contribution of a portion of the simulator to the overall simulator processing, such as device computation (solving equations associated with individual circuit components), matrix computation (solving equations associated with the circuit as a whole), timestep control, and the like.

Figure 3A:
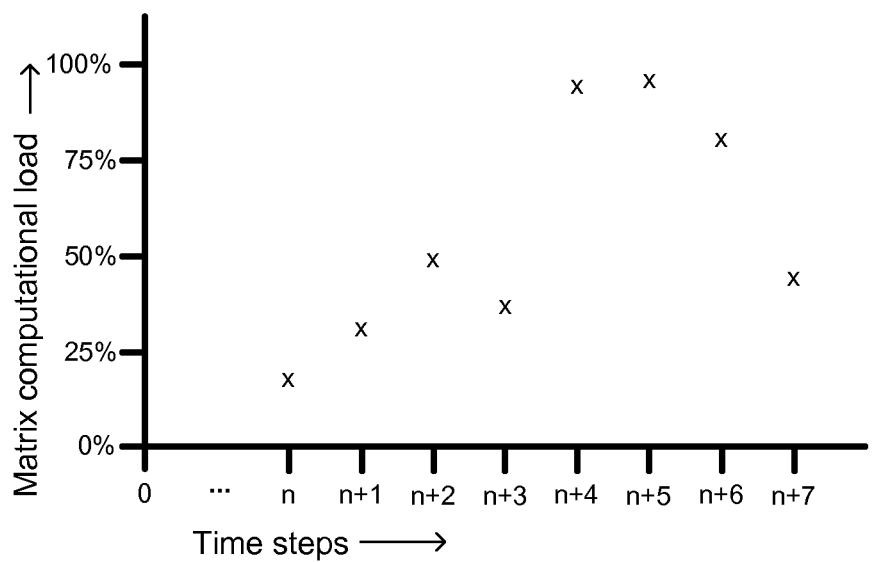
FIG. 3a is an output waveform illustrating a matrix computational load over time, according to one embodiment.

FIG. 3a is an output illustrating a matrix computational load by timestep, according to one embodiment. In the embodiment of FIG. 5a, the matrix computational load of the simulator is illustrated over 8 timesteps of simulation (timestep n through timestep n+7). For instance, at timestep n+3, the matrix computation portion of the simulator represents ~37.5% of the total computational load of the simulator, and at timestep n+4, the matrix computation portion of the simulator represents ~93% of the total computational load of the simulator. It should be noted that although matrix computational load is illustrated in the embodiment of FIG. 3a, the amount of computation required or the use of any resource during simulation can be illustrated in an output waveform.

Figure 3B:
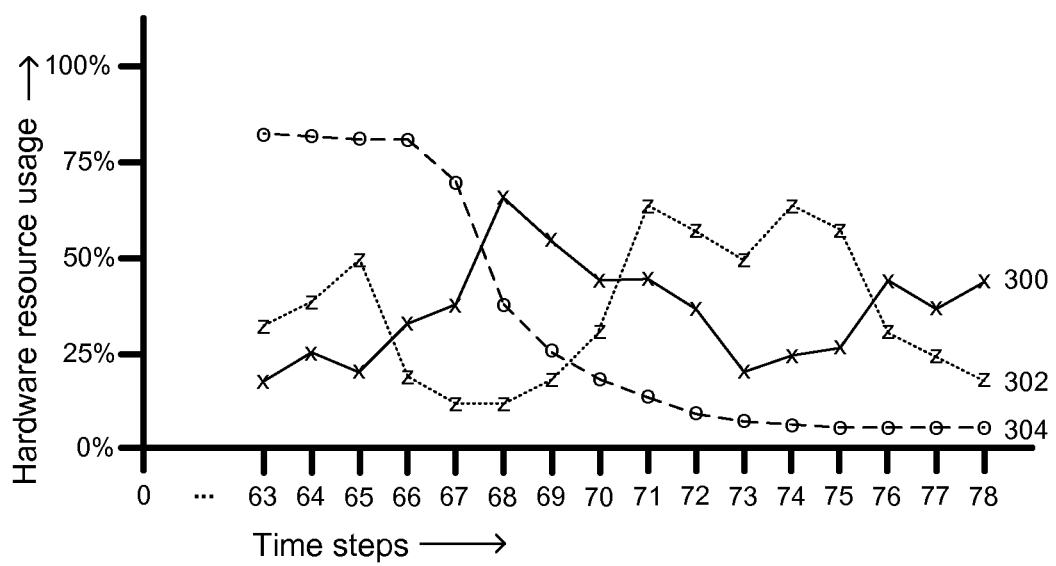
FIG. 3b is an output waveform illustrating the usage of multiple simulation resources over time, according to one embodiment.

The usage of multiple simulation resources during the simulation of a circuit's behavior can be illustrated in an output waveform. FIG. 3b is an output waveform illustrating the usage of multiple simulation resources over time, according to one embodiment. In the embodiment of FIG. 3b, the usage of three resources is illustrated: resource 300, resource 302, and resource 304. For example, resource 300 can represent the percentage of cores used in a simulation, resource 302 can represent the percentage of available memory used in the simulation, and resource 304 can representing the percentage of available hard disk space used in the simulation.

Generating an output waveform illustrating the usage of one or more resources during simulation beneficially allows a designer to identify timesteps within a simulation that require disproportionate resources to simulate. The designer can adjust simulation settings or circuit design for subsequent simulations in order to alleviate the bottleneck. In some embodiments, a waveform viewer can access various resource thresholds, for instance form a simulation log file, and can display these thresholds within output waveforms illustrating resource usage over time, allowing a designer to quickly identify timesteps during which such resource thresholds are exceeded.

While FIG. 2b illustrates the overlaid display of a simulation progress waveform with simulation data (a number of attempted timesteps at each time during simulation), in other embodiments, the simulation engine 114 can generate output files for correlation and adjacent display by a waveform viewer. For example, a user can define measurements that occur during simulation (such as internal circuit node signal values), and the simulator can insert a timestep specifically for the measurement or interpolate values from nearby timesteps for such a measurement. The waveform viewer can display defined measurements in a second waveform time-correlated with a simulation progress waveform. Similarly, a simulator can output a waveform illustrating resource usage over time, can correlate the waveform to a simulation progress waveform, and can display the two waveforms relative to the same simulation runtime.

Figure 4:
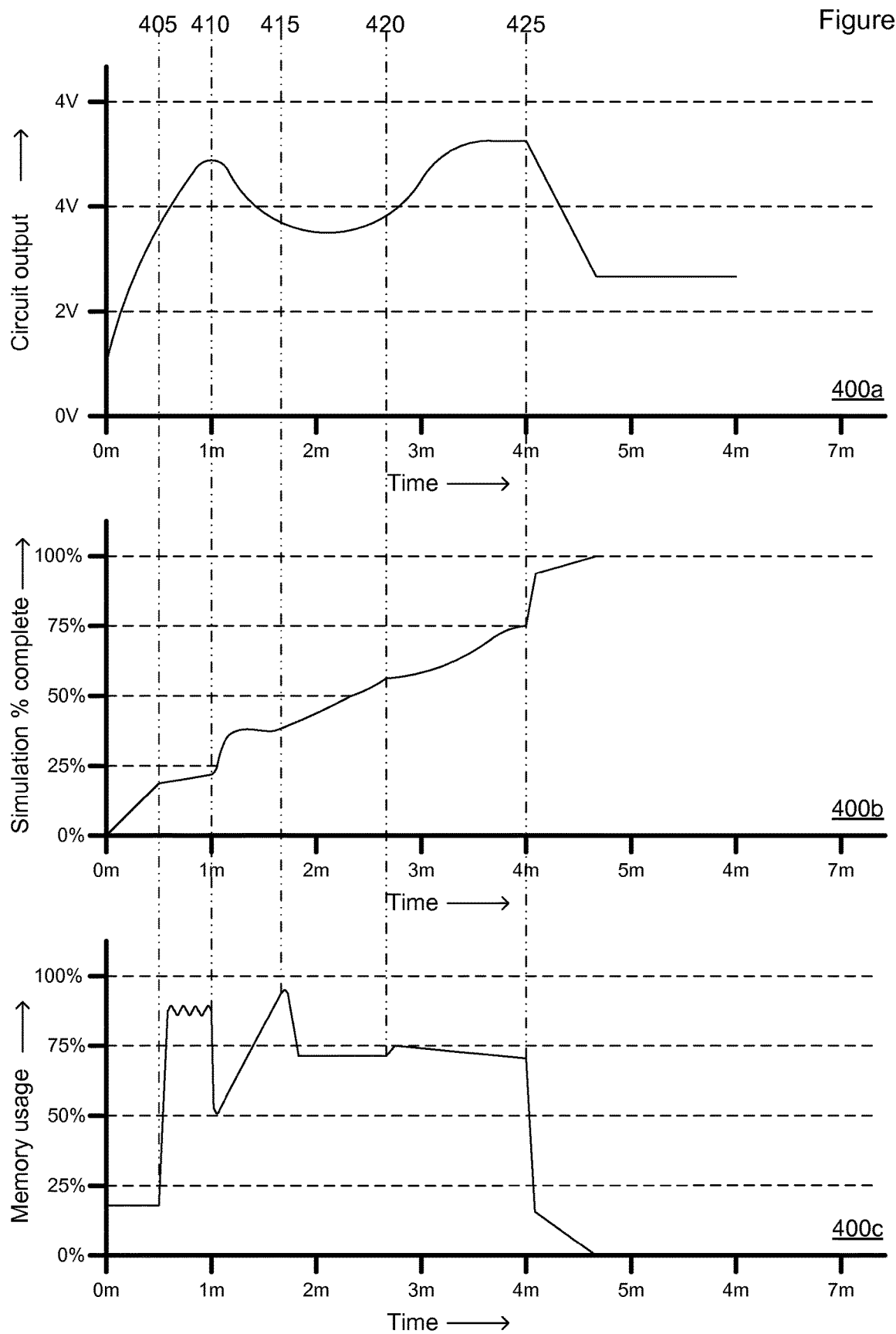
FIG. 4 illustrates multiple correlated output waveforms illustrating various simulation parameters over time, according to one embodiment.

FIG. 4 illustrates multiple correlated output waveforms illustrating various simulation parameters over time, according to one embodiment. In the embodiment of FIG. 4, a first waveform 400a is a circuit output waveform, for instance illustrating an output voltage or current of a circuit being simulated. A second waveform 400b illustrates a simulation completion measurement, and a third waveform 400c illustrates usage of a resource during the simulation.

By correlating multiple output waveforms within a common display, a designer can beneficially identify related aspects of simulation. In some embodiments, waveform viewer software can indicate related events within a simulation. For example, in the embodiment of FIG. 4, time 405 is highlighted. At time 405, simulation progress slows in waveform 400b, and resource usage spikes in waveform 400c. At time 410, the circuit output is a relative maximum in waveform 400a, simulation progress advances in waveform 400b, and resource usage subsides in waveform 400c. From time 410 to time 415, the circuit output decreases, the simulation progress increases, and the resource usage increases. From time 415 to time 420, the simulation progresses relatively constantly and the simulation resource usage becomes constant after a brief decrease. Finally, at time 425, the circuit output decreases, the simulation progress spikes, and the resource usage sharply decreases.

In the embodiment of FIG. 4, displaying correlated output waveforms allows a designer to identify simulation bottlenecks based on the waveform 400b (such as the simulation bottleneck between time 405 and time 410), and to identify associated spikes in resource usage (such as the spike in resource usage between time 405 and time 410). In some embodiments, the time scale of one or more output waveforms may need to be normalized in order to correlate output waveforms. Further, although the waveforms of FIG. 4 are shown as separate graphs, in some embodiments, the waveforms are displayed within a single graph. Providing correlated output waveforms beneficially provides a designer with greater context in evaluating the performance of a simulator in simulating a circuit's behavior.

In some embodiments, a waveform viewer indicates related events within a simulation by displaying a selectable icon, button, or other interface element configured to, when selected, display additional information about the event (for instance, simulation event information stored within a logfile created during simulation). In some embodiments, simulation events can be displayed as a separate waveform. Examples of simulator events can include one or more of the following: a switch by the simulation between algorithms, matrix solvers, or equations solvers used to simulation circuit behavior; the writing of simulation information to a log file or output waveform; the exceeding of a resource or measurement threshold during simulation (such as a memory capacity); identifying a simulation bottleneck; reconfiguring the simulation settings; allocating additional resources (such as additional memory or additional processor cores) to the simulation; or any other suitable event associated with simulating a circuit's behavior.

In association with each of the output waveforms described herein, a waveform viewer can display a selectable icon, button, or other interface element that, when selected, displays additional information associated with the simulation, for instance simulation information stored in a simulation output logfile. For example, in an output waveform illustrating a simulation completion measurement, if a designer selects such an interface corresponding to a timestep, information associated with a circuit event, internal circuit signals, a simulation event, a limiting circuit component, and the like can be displayed within a second interface (such as a pop-up window or an interface adjacent to or overlaid upon the output waveform interface). The additional information associated with the simulation can include one or more of: the size of simulated timesteps and number of attempted timesteps during simulation; the limiting or bottleneck circuit component at each timestep in the simulation; the number of Newton iterations for each timestep; the simulation computation contribution percentage between one or more of device computation, matrix computation, simulation control, and I/O; the resource usage load, such as a number of cores used in simulation, memory percentage usage, hard disk space usage, and the like; or any other suitable information associated with the simulation or a simulation event. A waveform viewer can color code timesteps within the simulation progress waveform associated with measurements or resource usage that exceed a pre-determined threshold for easy identification by a designer.

In some embodiments, a designer can use a waveform viewer to select particular timesteps or a particular simulation time period to view within a simulation progress waveform. For example, if a designer notices that bottlenecks frequently occur in the simulation of a circuit within the first 20 timesteps, the designer can customize the waveform viewer to display only the first 20 timesteps of a simulation progress waveform and/or additional output waveforms. Further, a waveform viewer can provide a customizable display with options to filter various types of information displayed within output waveforms, to select various waveforms for correlation, and the like.

A designer can adjust simulation settings or circuit design based on the display of a simulation progress waveform and additional information associated with the simulation, or associated with a simulation event. In some embodiments, a simulator can read a generated simulation progress waveform and any additional simulation information (for instance, from a simulation logfile) and use these as an input for a subsequent simulation of the same or a similar circuit. In such embodiments, the simulator can select simulation settings based on the simulation progress waveform and simulation information in order to optimize the subsequent simulation. Alternatively, a simulator might select different simulation settings based on the differences between the formerly simulated circuit and a variant of the circuit being subsequently simulated.

Figure 5:
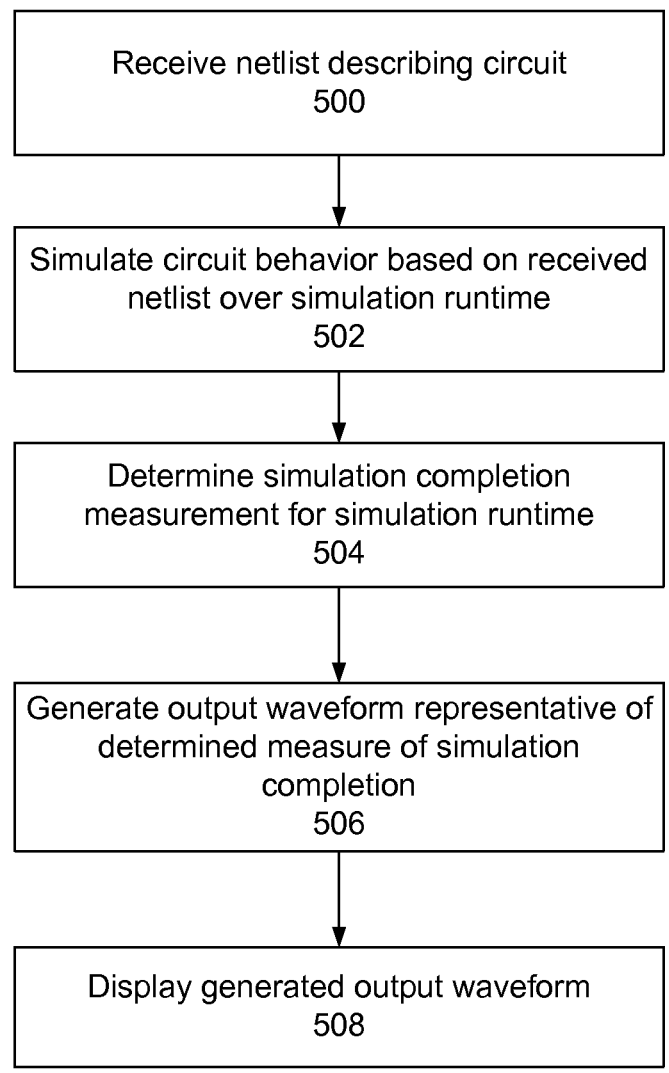
FIG. 5 is a flowchart illustrating a method for generating and displaying a graph of a simulation completion measurement over time, according to one embodiment.

FIG. 5 is a flowchart illustrating a method for generating and displaying a graph of a simulation completion measurement over time, according to one embodiment. A netlist or other circuit description is received 500. Behavior of the circuit described by the netlist is simulated 502 over a simulation runtime. A simulation completion measurement is determined 504 for each time in the simulation runtime. An output waveform representative of the determined measure of simulation is generated 506. The generated output waveform can then be subsequently display 508, for instance by a waveform viewer.

It should also be noted that reference is made to a "designer" herein for the purposes of simplicity only. In practice, any user can utilize the system and method described herein. Reference in the specification to "one embodiment" or to "an embodiment" means that a particular feature, structure, or characteristic described in connection with the embodiments is included in at least one embodiment. The appearances of the phrase "in one embodiment" or "an embodiment" in various places in the specification are not necessarily all referring to the same embodiment.

Some portions of the detailed description are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here, and generally, conceived to be a self-consistent sequence of steps (instructions) leading to a desired result. The steps are those requiring physical manipulations of physical quantities. Usually, though not necessarily, these quantities take the form of electrical, magnetic or optical signals capable of being stored, transferred, combined, compared and otherwise manipulated. It is convenient at times, principally for reasons of common usage, to refer to these signals as bits, values, elements, symbols, characters, terms, numbers, or the like. Furthermore, it is also convenient at times, to refer to certain arrangements of steps requiring physical manipulations or transformation of physical quantities or representations of physical quantities as modules or code devices, without loss of generality.

However, all of these and similar terms are to be associated with the appropriate physical quantities and are merely convenient labels applied to these quantities. Unless specifically stated otherwise as apparent from the following discussion, it is appreciated that throughout the description, discussions utilizing terms such as "processing" or "computing" or "calculating" or "determining" or "displaying" or "determining" or the like, refer to the action and processes of a computer system, or similar electronic computing device (such as a specific computing machine), that manipulates and transforms data represented as physical (electronic) quantities within the computer system memories or registers or other such information storage, transmission or display devices.

Certain aspects of the embodiments include process steps and instructions described herein in the form of an algorithm. It should be noted that the process steps and instructions of the embodiments can be embodied in software, firmware or hardware, and when embodied in software, could be downloaded to reside on and be operated from different platforms used by a variety of operating systems. The embodiments can also be in a computer program product which can be executed on a computing system.

The embodiments also relate to an apparatus for performing the operations herein. This apparatus may be specially constructed for the purposes, e.g., a specific computer, or it may comprise a general-purpose computer selectively activated or reconfigured by a computer program stored in the computer. Such a computer program may be stored in a computer readable storage medium, such as, but is not limited to, any type of disk including floppy disks, optical disks, CD-ROMs, magnetic-optical disks, read-only memories (ROMs), random access memories (RAMs), EPROMs, EEPROMs, magnetic or optical cards, application specific integrated circuits (ASICs), or any type of media suitable for storing electronic instructions, and each coupled to a computer system bus. Memory can include any of the above and/or other devices that can store information/data/programs and can be transient or non-transient medium, where a non-transient or non-transitory medium can include memory/storage that stores information for more than a minimal duration. Furthermore, the computers referred to in the specification may include a single processor or may be architectures employing multiple processor designs for increased computing capability.

The algorithms and displays presented herein are not inherently related to any particular computer or other apparatus. Various general-purpose systems may also be used with programs in accordance with the teachings herein, or it may prove convenient to construct more specialized apparatus to perform the method steps. The structure for a variety of these systems will appear from the description herein. In addition, the embodiments are not described with reference to any particular programming language. It will be appreciated that a variety of programming languages may be used to implement the teachings of the embodiments as described herein, and any references herein to specific languages are provided for disclosure of enablement and best mode.

In addition, the language used in the specification has been principally selected for readability and instructional purposes, and may not have been selected to delineate or circumscribe the inventive subject matter. Accordingly, the disclosure of the embodiments is intended to be illustrative, but not limiting, of the scope of the embodiments.

While particular embodiments and applications have been illustrated and described herein, it is to be understood that the embodiments are not limited to the precise construction and components disclosed herein and that various modifications, changes, and variations may be made in the arrangement, operation, and details of the methods and apparatuses of the embodiments without departing from the spirit and scope of the embodiments.

What is claimed is:

1. A method comprising:
   simulating, by a processor in a simulator, behavior of a circuit over a simulation runtime period based on a netlist, wherein the simulator, at each time period of the simulation runtime, is configured to iteratively select timesteps having different time intervals used to simulate the behavior of the circuit;
   determining, by the processor, simulation completion measurements describing progress of the simulation of the behavior of the circuit during the simulation runtime period, wherein the simulation completion measurements are measurements of completed steps in the simulation of the behavior of the circuit at different times during the simulation runtime period, and wherein the determining of the simulation completion measurements includes identifying one or more intervals of time exceeding a threshold amount of time during which the simulation completion measurements do not increase by more than a simulation completion measurement threshold;
   identifying, by the processor for each of the time periods of the simulation runtime, a number of the timesteps iteratively selected by the simulator for the simulation of the behavior of the circuit; and
   generating, by the processor, a waveform presentation including a waveform of the simulation completion measurements determined at the different times during the simulation runtime period and an indication of the identified number of the timesteps selected by the simulator at each of the corresponding time periods of the simulation runtime period, wherein the waveform of the simulation completion measurements includes a plurality of the simulation completion measurements determined over the simulation runtime period and shows the simulation completion measurements relative to when the simulation completion measurements were determined during the simulation runtime period.

2. The method of claim 1, wherein the simulation completion measurements comprises one or more of a percentage of equations associated with the simulation that are solved, a percentage of variables in a set of equations associated with the simulation of the circuit behavior that are solved, and a percentage of completed steps in the simulation.

3. The method of claim 1, further comprising outputting the identified intervals of time to a simulation output logfile for inclusion in a display of the generated waveform presentation.

4. The method of claim 1, further comprising outputting, by the processors, the numbers of the timesteps to a simulation output logfile for inclusion in a display of the generated waveform presentation.

5. The method of claim 1, further comprising:
   determining, by the processor, resource usage measurements relative to the simulation runtime period, wherein the resource usage measurements describe amounts of a hardware resource of the simulator that were utilized to simulate the behavior of the circuit over the simulation runtime period; and
   displaying, by a waveform viewer, the generated waveform presentation and the resource usage measurements relative to the simulation runtime period.

6. The method of claim 5, further comprising generating another waveform presentation of the determined resource usage measurements relative to the simulation runtime period.

7. The method of claim 6, further comprising:
   correlating, by the waveform viewer, one or more simulation events between the waveform presentation and the another waveform presentation; and
   including, by the waveform viewer, a selectable interface within the waveform presentation or the another waveform presentation configured to, when selected, display additional information associated with the correlated simulation events.

8. A non-transitory computer-readable storage medium storing computer-executable program instructions configured to, when executed by a processor, cause the processor to perform steps comprising:
   simulating, in a simulator, behavior of a circuit over a simulation runtime period based on a netlist, wherein the simulator, at each time period of the simulation runtime, is configured to iteratively select timesteps having different time intervals used to simulate the behavior of the circuit;
   determining simulation completion measurements describing progress of the simulation of the behavior of the circuit during the simulation runtime period, wherein the simulation completion measurements are measurements of completed steps in the simulation of the behavior of the circuit at different times during the simulation runtime period, and wherein the determining of the simulation completion measurements includes identifying one or more intervals of time exceeding a threshold amount of time during which the simulation completion measurements do not increase by more than a simulation completion measurement threshold;
   identifying, for each of the time periods of the simulation runtime, a number of the timesteps iteratively selected by the simulator for the simulation of the behavior of the circuit; and
   generating a waveform presentation including a waveform of the simulation completion measurements determined at different times during the simulation runtime period and an indication of the identified number of the timesteps selected by the simulator at each of the corresponding time periods of the simulation runtime period, wherein the waveform of the simulation completion measurements includes a plurality of the simulation completion measurements determined over the simulation runtime period and shows the simulation completion measurements relative to when the simulation completion measurements were determined during the simulation runtime period.

9. The computer-readable storage medium of claim 8, wherein the simulation completion measurements comprises one or more of a percentage of equations associated with the simulation that are solved, a percentage of variables in a set of equations associated with the simulation of the circuit behavior that are solved, and a percentage of completed steps in the simulation.

10. The computer-readable storage medium of claim 8, wherein the instructions are configured to cause the processor to perform further steps comprising outputting the identified intervals of time to a simulation output logfile for inclusion in a display of the generated waveform presentation.

11. The computer-readable storage medium of claim 8, wherein the instructions are configured to cause the processor to perform further steps comprising outputting the numbers of the timesteps to a simulation output logfile for inclusion in a display of the generated waveform presentation.

12. The computer-readable storage medium of claim 8, wherein the instructions are configured to cause the processor to perform further steps comprising:
  determining resource usage measurements relative to the simulation runtime period, wherein the resource usage measurements describe amounts of a hardware resource of the simulator that were utilized to simulate the behavior of the circuit over the simulation runtime period; and
  prompting display, by a waveform viewer, of the generated waveform presentation and the resource usage measurements relative to the simulation runtime period.

13. The computer-readable storage medium of claim 12, wherein the instructions are configured to cause the processor to perform further steps comprising generating a second waveform presentation of the determined resource usage measurements relative to the simulation runtime period.

14. The computer-readable storage medium of claim 13, wherein the instructions are configured to cause the processor to perform further steps comprising:
  correlating, by the waveform viewer, one or more simulation events between the waveform presentation and the another waveform presentation; and
  including, by the waveform viewer, a selectable interface within the waveform presentation or the another waveform presentation configured to, when selected, display additional information associated with the correlated simulation events.

15. A system comprising a processor and a non-transitory computer-readable storage medium storing computer program instructions configured to, when executed by the processor, cause the processor to perform steps comprising:
  simulating, with a simulator, behavior of a circuit over a simulation runtime period based on a netlist, wherein the simulator, at each time period of the simulation runtime, is configured to iteratively select timesteps having different time intervals used to simulate the behavior of the circuit;
  determining simulation completion measurements describing progress of the simulation of the behavior of the circuit during the simulation runtime period, wherein the simulation completion measurements are measurements of completed steps in the simulation of the behavior of the circuit at different times during the simulation runtime period, and wherein the determining of the simulation completion measurements includes identifying one or more intervals of time exceeding a threshold amount of time during which the simulation completion measurements do not increase by more than a simulation completion measurement threshold;
  identifying, for each of the time periods of the simulation runtime, a number of the timesteps iteratively selected by the simulator for the simulation of the behavior of the circuit; and
  generating a waveform presentation including a waveform of the simulation completion measurements determined at different times during the simulation runtime period and an indication of the identified number of the timesteps selected by the simulator at each of the corresponding time periods of the simulation runtime period, wherein the waveform of the simulation completion measurements includes a plurality of the simulation completion measurements determined over the simulation runtime period and shows the simulation completion measurements relative to when the simulation completion measurements were determined during the simulation runtime period.

16. The system of claim 15, wherein the simulation completion measurements comprises one or more of a percentage of equations associated with the simulation that are solved, a percentage of variables in a set of equations associated with the simulation of the circuit behavior that are solved, and a percentage of completed steps in the simulation.

17. The system of claim 15, wherein the instructions are configured to cause the processor to perform further steps comprising outputting the identified intervals of time to a simulation output logfile for inclusion in a display of the generated waveform presentation.

18. The system of claim 15, wherein the instructions are configured to cause the processor to perform further steps comprising outputting the numbers of the timesteps to a simulation output logfile for inclusion in a display of the generated waveform presentation.

19. The system of claim 15, wherein the instructions are configured to cause the processor to perform further steps comprising generating another waveform presentation representative of the determined resource usage measurements relative to the simulation runtime period.

20. The system of claim 19, wherein the instructions are configured to cause the processor to perform further steps comprising:
  correlating, by the waveform viewer, one or more simulation events between the waveform presentation and the another waveform presentation; and
  including, by the waveform viewer, a selectable interface within the waveform presentation or the another waveform presentation configured to, when selected, display additional information associated with the correlated simulation events.

* * * * *